United States Patent [19]
Saeki

[11] Patent Number: 5,305,252
[45] Date of Patent: Apr. 19, 1994

[54] SEMICONDUCTOR MEMORY DEVICE HAVING MEMORY CELL MATRIX OBLIQUELY ARRANGED WITH RESPECT TO BIT LINES

[75] Inventor: Takanori Saeki, Tokyo, Japan

[73] Assignee: NEC Corporation, Tokyo, Japan

[21] Appl. No.: 119,531

[22] Filed: Sep. 13, 1993

Related U.S. Application Data

[63] Continuation of Ser. No. 726,663, Jul. 8, 1991, abandoned.

[30] Foreign Application Priority Data

Jul. 6, 1990 [JP] Japan .................. 2-178850

[51] Int. Cl.⁵ .............. G11C 13/00; H01L 27/10; H01L 29/68
[52] U.S. Cl. .................. 365/63; 365/189.01; 365/196; 365/202; 365/207
[58] Field of Search .............. 365/52; 357/45

[56] References Cited

U.S. PATENT DOCUMENTS

| | | | |
|---|---|---|---|
| 4,586,171 | 4/1986 | Fujishima | 365/63 |
| 4,651,183 | 3/1987 | Lange et al. | 357/45 |
| 5,012,309 | 4/1991 | Nakayama | 357/45 |
| 5,014,103 | 5/1991 | Ema | 357/45 |
| 5,045,899 | 9/1991 | Arimoto | 357/45 |

FOREIGN PATENT DOCUMENTS

| | | |
|---|---|---|
| 0399531 | 11/1990 | European Pat. Off. |
| 0428247 | 5/1991 | European Pat. Off. |
| 1-179449 | 7/1989 | Japan |

Primary Examiner—Eugene R. LaRoche
Assistant Examiner—Viet Q. Nguyen
Attorney, Agent, or Firm—Sughrue, Mion, Zinn, Macpeak & Seas

[57] ABSTRACT

A dynamic random access memory device comprises a matrix of memory cell pairs each consisting of two memory cells formed in an active area, a plurality of word line pairs provided in association with the columns of the memory cell pairs, and a plurality of first bit lines respectively paired with a plurality of second bit lines for forming a plurality of bit line pairs, and every adjacent two rows of the memory cell pairs are alternately coupled to the first and second bit lines of one of the bit line pairs, wherein the active area is formed into a generally rectangular shape having a longitudinal direction obliquely extending with respect to the longitudinal direction of the associated first or second bit line so that a vacancy between two adjacent memory cell pairs is minimized without sacrifice of simple pattern of a field oxide film.

7 Claims, 18 Drawing Sheets

SEMICONDUCTOR MEMORY DEVICE HAVING MEMORY CELL MATRIX OBLIQUELY ARRANGED WITH RESPECT TO BIT LINES

This is a continuation of application Ser. No. 07/726,663 filed Jul. 8, 1991, abandoned.

FIELD OF THE INVENTION

This invention relates to a semiconductor memory device and, more particularly, to the arrangement of random access memory cells with respect to the direction of row.

DESCRIPTION OF THE RELATED ARTS

A typical example of a random access memory cell is known as "single-transistor single-capacitor cell" which is shown in FIG. 1 of the drawings. The random access memory cell is implemented by a series combination of a switching transistor SW1 and a storage capacitor coupled between a bit line BL and a ground voltage node GND. The switching transistor SW1 is gated by a word line WL, and conducts the bit line BL to the storage capacitor CP1 in the presence of an active voltage level on the word line WL. A data bit is stored in the storage capacitor CP1 in the form of electric charges, and the data bit is supplied from and to the bit line BL so that the random access memory cell provides a data storage for an external device.

In order to fabricate a dynamic random access memory device from the single-transistor single-capacitor memory cells, the memory cells are arranged in rows and columns in association with word lines and bit line pairs. FIG. 2 shows one of the rows of the memory cells M1, M2, M3, M4, M5, ... forming a part of a memory cell array MA31, and the memory cells M1 to M5 are selectively coupled to bit lines BL1 and BL2 terminated at a sense amplifier circuit SA1. Namely, the memory cells M1 and M3 are respectively paired with the memory cells M2 and M4, and the memory cells M1/M2 and M3/M4 form memory cell pairs MP1 and MP2. Although the memory cell M5 is also paired with a memory cell (not shown), the memory cell pair is not shown for the sake of simplicity. The memory cell pairs MP1 and MP2 are coupled to the bit lines BL1 and BL2, respectively, and the bit lines BL1 and BL2 extend in parallel to the row of the memory cells M1 to M5 for improving the sensitivity of the sense amplifier circuit SA1. Word lines WL1, WL2, WL3, WL4 and WL5 extend substantially perpendicular to the bit lines BL1 and BL2, and are coupled to the switching transistors of the memory cells M1 to M5, respectively. The memory cells M1 to M5 are located at respective crossing points between the bit lines BL1 and BL2 and the word lines WL1 to WL5. However, all of the crossing points are not occupied by the memory cells M1 to M5. Namely, the crossing points enclosed by dash lines are vacant. This is because of the fact that the memory cell pairs MP1 and MP2 are alternately coupled to the bit lines BL1 and BL2. In detail, assuming now that the dynamic random access memory device is fabricated on a semiconductor substrate 31, and active areas 31a, 31b, 31c, 31d, 31e, 31f, 31g and 31h are defined in the major surface of the semiconductor substrate 31 as shown in FIG. 3. The active areas 31a and 31c are occupied by the memory cell pairs MP1 and MP2, respectively, and the memory cell pairs MP1 and MP2 are coupled through respective contact holes 32a and 32c to the bit lines BL1 and BL2, respectively. Other contact holes 32b, 32d, 32e and 32f also couple memory cell pairs in the active areas 31b, 31d, 31e and 31f to associated bit lines BL3, BL4 and BL1. The bit lines BL3 and BL4 are terminated at a sense amplifier circuit SA2 as similar to the bit lines BL1 and BL2. Let us focus our attention on the word lines WL1 and WL2. The word lines WL1 and WL2 cross the bit line BL1 coupled to the memory cell pair in the active area 31a, and pass over the bit line BL2 without any connection to memory cells, then crossing the bit line BL3 coupled to the memory cell pair in the active area 31b, merely passing over the bit line BL4 again. with respect to contact holes 31a to 31f, every contact hole is coupled to the associated bit line at a interval of four word lines. Every eight crossing points between two bit lines and four word lines form a pattern for the memory cell array MA31, and four memory cells are formed in the pattern. This means that every memory cell occupies two crossing points between adjacent two word lines and a bit line equivalent to an area 33. Thus, every prior art memory cell consumes a large amount of real estate on the semiconductor substrate 31 due to the numbers of vacant sites, and, accordingly, the prior art random access memory device cannot increase the number of the memory cells without a corresponding increase in the chip size.

FIG. 4 shows another prior art random access memory device fabricated on a semiconductor substrate 41, and active areas 41a, 41b, 41c, 41d, 41e, 41f, 41g, 41h, 41i, 41j, 41k and 41l are defined in the major surface of the semiconductor substrate 41. In every active area, two single-transistor single-capacitor memory cells are formed to form a memory cell pair, and every memory cell pair is coupled through a contact hole 42a, 42b, 42c, 42d, 42e, 42f, 42g, 42h, 42i, 42j, 42k or 42l to a bit line BL1, BL2, BL3, BL4, BL5, BL6 or BL7. The bit lines BL1 and BL5 are respectively paired with the bit lines BL3 and BL7, and each of the bit lines BL2, BL4 and BL6 is interposed between the bit lines BL1, BL3, BL5 and BL7. The bit lines BL2 and BL6 are respectively paired with the bit lines BL4 and BL8. The bit lines BL1, BL3, BL5 and BL7 are terminated at sense amplifier circuits SA1 and SA3 on the right side of a memory cell array MA41, and the bit lines BL2, BL4, BL6 and BL8 are terminated at sense amplifier circuits SA2 and SA4 provided on the left side of the memory cell array MA41. Thus, the bit line pairs for the sense amplifier circuits SA1 and SA3 interdigitate with the bit line pairs for the sense amplifier circuits SA2 and SA4. Word lines WL1, WL2, WL3, WL4, WL5, WL6, WL7 and WL8 extend substantially perpendicular to the bit lines BL1 to BL8 which are substantially in parallel to the direction of row of the memory cells. Every two word lines such as WL1 and WL2 cross the bit line BL1 coupled to the memory cell pair in the active area 41a, pass over two bit lines BL2 and BL3 without any contact with a memory cell, one of the word lines cross the bit line BL4 coupled to one of the memory cell pair in the active area 41c, and both word lines WL1 and WL2 cross the bit line BL5 coupled to the bit line pair in the active area 41b. However, every contact hole is provided for a bit line at an interval of four word lines, and an occupation area of a single memory cell is tantamount to an area 43 containing two crossing points. In the arrangement shown in FIG. 4, each of the sense amplifier circuits SA1 to SA4 is provided at an interval of four bit lines, and, for this reason, the sense amplifier circuits SA1 to SA4 are fabricated from large sized component transistors with large current driving capabilities. Such large sized component transistors improve stability of the sense amplifier circuits SA1 to SA4 even if the interval between adjacent two bit lines is decreased. Moreover, sixteen crossing points between four bit lines and four word lines define a pattern for the memory cell array MA41, and eight memory cells are provided in every pattern. This arrangement may improve regularity of the contact holes 42a to 42l. However, a large number of the crossing points are still vacant, and every memory cell occupies a large amount of real estate. The sense amplifier circuits SA1 to SA4 on both sides of the memory cell array MA41 further require additional real estate in the major surface of the semiconductor substrate 41.

As to the three dimensional structure of the prior art random access memory device shown in FIGS. 2 and 3, while the memory cell arrays MA31 is approximately 1 mega-bit or less, the storage capacitor CP1 is of the planar type. In detail, as shown in FIGS. 5 and 6, the memory cells M1 and M2 are fabricated on a p-type semiconductor substrate 51, and a thick field oxide film 52 defines the active area 31a. The active area 31a is doped with n-type impurity atoms, and is covered with a thin oxide film 52a. On the thin oxide film 52a is patterned a counter electrode 53 which is shaped between the memory cells M1, M2, . . . , and the counter electrode 53 is covered with a first inter-level oxide film 54. The word lines WL1, WL2 and WL3 extend in parallel over the first inter-level oxide film 54, and are lowered through contact holes formed in the fist inter-level oxide film 54 onto the thin oxide film 52a so as to provide gate electrodes of the switching transistors. The word lines WL1 to WL3 are covered with a second inter-level oxide film 55, and the contact hole 32a projects through the first and second inter-level oxide films 54 and 55. The bit line BL1 passes through the contact hole 32a, and is held in contact with the n-type impurity region formed in the active area 31a. The counter electrode 53 is located on the same level as the gate electrodes of the switching transistors, and laterally extends on the thin oxide film 52a. For this reason, each memory cell occupies a relatively large amount of real estate, and the integration density cannot exceed 1 mega-bits.

If the memory cell array MA31 is as large as 4 mega-bits, the three dimensional structure is different from that shown in FIGS. 5 and 6. Each of the memory cells has a trench type storage capacitor as shown in FIG. 7 and 8, and inter-level oxide films are removed from the structure shown in FIG. 7 for the sake of simplicity. In detail, the memory cell array MA31 is fabricated on a p-type semiconductor substrate 71, and a thick field oxide 72 defines active areas 31a and 31c in the major surface of the semiconductor substrate 71. Trenches 71a and 71b are formed in the p-type semiconductor substrate 71, and n-type impurity atoms are selectively doped into the active areas 31a and 31c as well as wall portions along the trenches 71a and 71b so that source/drain regions as well as accumulating electrodes are provided in the semiconductor substrate. For better understanding, the trenches 71a and 71b are marked with "X" in FIG. 7. A thin oxide film 72a covers the wall portions and the major surface in the active areas 31a and 31b, and a counter electrode 73 extends along the wall portions and the thick field oxide film 72. Generally rectangular apertures 73a and 73b are formed in the counter electrode 73, and a first inter-level oxide film 74 covers the counter electrode 73. On the first inter-level oxide film 74 extend the word lines WL1 to WL3 which are lowered in the generally rectangular apertures 73a and 73b onto the thin oxide film 72a so as to provide gate electrodes of the switching transistors. The word lines WL1 to WL3 are overlain by a second inter-level oxide film 75, and the contact holes 32a and 32c are formed in the first and second inter-level oxide films 74 and 75. The bit lines BL1 and BL2 extend over the second inter-level oxide film 75, and are held in contact with one of the n -type source/drain regions through the contact holes 32a d 32c, respectively. Since the trench type storage capacitor vertically extends, the real estate of the storage capacitor is smaller than the planar type storage capacitor, and, accordingly, allows the memory cell array MA31 to increase the component memory cells to 4 mega-bits.

However, a stacked type storage capacitor is also employed in another prior art 4 mega-bit random access memory device. For the sake of simplicity, inter-level oxide films are also removed from the structure shown in FIG. 9. The 4 mega-bit random access memory device is fabricated on a p-type semiconductor substrate 91, and a thick field oxide film 92 is selectively grown on the major surface of the p-type semiconductor substrate 91 so that active areas 91a, 91b and 91c are defined in the major surface. N-type impurity atoms are selectively doped into the active areas 91a so that n-type source/drain regions are produced for switching transistors. A thin oxide film 92a covers the major surface in the active areas 91a, 91b and 91c, and word lines extend over the thick field oxide film 92 as well as the thin oxide film 92a, thereby providing gate electrodes of the switching transistors. The word lines WL11 to WL14 are overlain by a first inter-level oxide film 93, and accumulating electrodes 94a and 94b are formed on the first inter-level oxide film 93. The accumulating electrodes 94a and 94b are electrically coupled through contact holes formed in the first inter-level oxide film 93 to the associated switching transistors, and thin dielectric films 95a and 95b cover the accumulating electrodes 95a and 95b, respectively. The contact holes formed in the first inter-level oxide film 93 are marked with "X" in FIG. 9. A counter electrode 96 is held in contact with the thin dielectric films 95a and 95b, and is shared between a plurality of memory cells. Rectangular apertures 96a, 96b and 96c are formed in the counter electrode 96 so that bit lines BL11 and BL12 are held in contact with the switching transistors through contact holes 97a formed in a second inter-level oxide film 97.

However, if the memory cell array MA31 is increased to 16 mega-bits and more, or improved three dimensional structure is employed in the random access memory device.

The structure shown in FIGS. 11 and 12 is disclosed in "3-DIMENSIONAL STACKED CAPACITOR CELL FOR 16M AND 64M DRAMS", 1988 IEDM, Proceedings, pages 592 to 595. For better understanding, inter-level oxide films, dielectric films of storage capacitors and a counter electrode are removed from FIG. 11. The random access memory device is fabricated on a silicon substrate 110, and a thick field oxide film 111 is selectively grown on the major surface of the silicon substrate 110 so that active areas 31a and 31c are defined in the major surface of the silicon substrate 110. Heavily doped source and drain regions 112a, 112b and 112c are selectively formed in the active areas 31a ad 31c, and a thin oxide film 111a is grown on the active areas 31a and 31c. The word lines WL1 to WL3 are lowered from the thick field oxide film 111 onto the thin oxide film 111a for providing gate electrodes of the switching transistors. A first inter-level oxide film structure 113a covers the word lines WL1 to WL3, and the bit lines BL1 and BL2 are embedded in the first inter-level oxide film structure 113a. The bit lines BL1 and BL2 are covered with a second inter-level oxide film 113b, and are connected through the contact holes 32a and 32c to the switching transistors, respectively. On the first inter-level oxide film structure 113a and the second inter-level oxide film 113b are formed accumulating electrodes 114a and 114b which are held in contact with the source regions 112a and 112c through contact holes 115a and 115b formed in the first inter-level oxide film structure 113a. The accumulating electrodes 114a and 114b are covered with thin dielectric films 116a and 116b, and a counter electrode 117 is provided on the thin dielectric films 116a and 116b. Although the contact hole 31a is slightly deviated from a virtual line interconnecting centers of the contact holes 115a and 115b, the bit line BL1 is substantially in parallel to the virtual line, and the word lines WL1 and WL2 extend substantially in parallel to the virtual line.

FIGS. 13 and 14 show another prior art 16 mega-bit dynamic random access memory device disclosed in "A NEW STACKED CAPACITOR DRAM CELL CHARACTERIZED BY A STORAGE CAPACITOR ON A BIT-LINE STRUCTURE", 1988 IEDM, Proceedings, pages 596 to 599. For the sake of simplicity, inter-level oxide films, dielectric films of storage capacitors and a counter electrode are removed from FIG. 13. The random access memory device is fabricated on a silicon substrate 120, and a thick field oxide film 121 is selectively grown on the major surface of the silicon substrate 120 so that active areas 131a and 131c are defined in the major surface of the silicon substrate 120. Heavily doped source and drain regions 122a, 122b and 122c are selectively formed in the active areas 131a and 131c, and a thin oxide film 121a is grown on the active areas 131a and 131c. The word lines WL11 to WL13 are lowered from the thick field oxide film 121 onto the thin oxide film 121a for providing gate electrodes of the switching transistors. A first inter-level oxide film structure 123a covers the word lines WL11 to WL13, and the bit lines BL11 and BL12 are embedded in the first inter-level oxide film structure 123a. The bit lines BL11 and BL12 are covered with a second inter-level oxide film 123b, and are connected through the contact holes 132a and 132c to the switching transistors, respectively. On the first inter-level oxide film structure 123a and the second inter-level oxide film 123b are formed accumulating electrodes 124a and 124b which are held in contact with the source regions 122a and 122c through contact holes 125a and 125b formed in the first inter-level oxide film structure 123a. The accumulating electrodes 124a and 124b are covered with thin dielectric films 126a and 126b, and a counter electrode 127 is provided on the thin dielectric films 126a and 126b. The 16 mega-bit dynamic random access memory device shown in FIGS. 13 and 14 is slightly different from that shown in FIGS. 11 and 12, and each of the active areas 131a and 131c consists of two end portions E1 and E2 parallel to the bit line BL11 and an oblique portion QL interposed between the two end portions E1 and E2. However, the oblique portion of the active area 131a is different in direction from that of the active area 131c at about 90 degrees. This is because of the fact that the contact holes 125a and 125 are arranged in such a manner as to be symmetrical to contact holes 125c and 125d with respect to the bit line BL11.

As will be understood from the foregoing description, each of the trench type storage capacitor and the stacked type storage capacitor occupies the real estate smaller than that occupied by the planar type storage capacitor. However, in order to further increase memory cells integrated on a single dynamic random access memory device, a new approach is necessary.

If a dynamic random access memory device is of the type illustrated in FIG. 3 or FIG. 4, the prior art three dimensional structures, except for the structure shown in FIGS. 13 and 14, cause each memory cell pair to occupy the real estate for a single bit line and two word lines as described hereinbefore, and a vacancy takes place between the adjacent two active areas for allowing the single bit line and adjacent two word lines to pass therethrough. The prior art structures shown in FIG. 5, 7, 9 and 11 have respective rectangular vacancies, because the word lines extend perpendicular to the bit lines which are parallel to the row memory cells. Each of the rectangular vacancy has short sides equal to the short side of the active area, and the short side equal to that of the active area increases the amount of area left vacant, because the short side of the active area is much longer than the minimum width achievable through a current lithographic process. Moreover, the row of the memory cells parallel to the bit line causes the pitch between adjacent two bit lines to be equal to the short side of the active area, and the wide pitch much longer than the minimum width which further increases vacant real estate.

Turning to the prior art structure shown in FIG. 13, the memory cells are obliquely arranged with respect to the bit line BL11, and, accordingly, different from the prior art structures discussed above. However, as described hereinbefore, the oblique portions QL extend in different directions by about 90 degrees, and the thick field oxide film 121 between adjacent two active areas varies in width as indicated by D1, D2 and D3 in FIG. 13. This results in a complex pattern causative of large vacancies, and increases the pitch between the bit lines BL11 and BL12 much wider than the minimum width achievable through the currently available lithographic process.

Thus, all of the prior art structures have a first problem in area efficiency and a second problem in wide pitch between adjacent two bit lines. The second problem is serious in the arrangement shown in FIG. 4, because a real estate at an interval of four bit lines is too much to fabricate a sense amplifier circuit.

SUMMARY OF THE INVENTION

It is therefore an important object of the present invention to provide a semiconductor memory device which decreases the amount of vacant space without sacrifice of simple pattern of a field oxide.

If is also an important object of the present invention to provide a semiconductor memory device which decreases pitch between adjacent two bit lines.

To accomplish these objects, the present invention proposes to obliquely arrange generally rectangular active areas with respect to associated bit lines.

In accordance with the present invention, there is provided a semiconductor memory device fabricated on a single semiconductor chip, comprising: a) a plurality of word line pairs each formed by adjacent two word lines; b) a plurality of first bit lines respectively paired with a plurality of second bit lines for forming a plurality of bit line pairs; and c) a plurality of memory cell pairs arranged in rows and columns, the rows of the plurality of memory cell pairs being selectively coupled to the first and second bit lines, the columns of the plurality of memory cell pairs being respectively coupled to the word line pairs, the memory cell pairs being respectively formed in generally rectangular active areas having respective longitudinal directions obliquely extending with respect to longitudinal directions of the associated first and second bit lines, the longitudinal directions of the generally rectangular active areas being substantially in parallel to one another.

BRIEF DESCRIPTION OF THE DRAWINGS

The features and advantages of the semiconductor memory device according to the present invention will be more clearly understood from the following description taken in conjunction with the accompanying drawings in which.

DESCRIPTION OF THE PREFERRED EMBODIMENTS

First Embodiment

Figure 1:
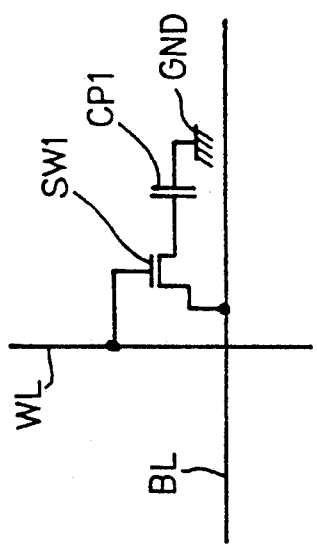
FIG. 1 is an equivalent circuit diagram showing the random access memory cell of the type known as "single-transistor single-capacitor cell"
Figure 2:
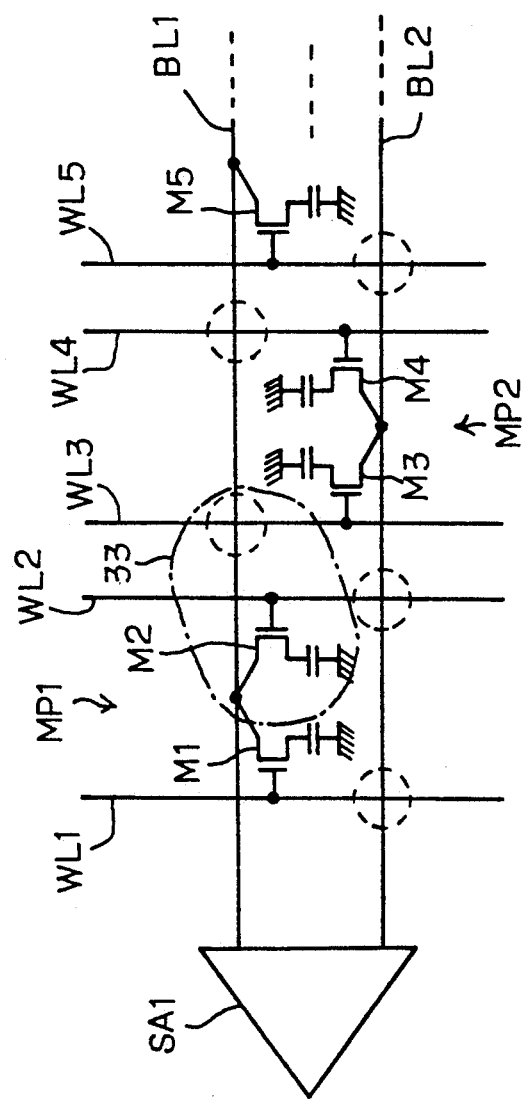
FIG. 2 is a circuit diagram showing the arrangement of a part of the memory cell matrix incorporated in a prior art random access memory device.
Figure 3:
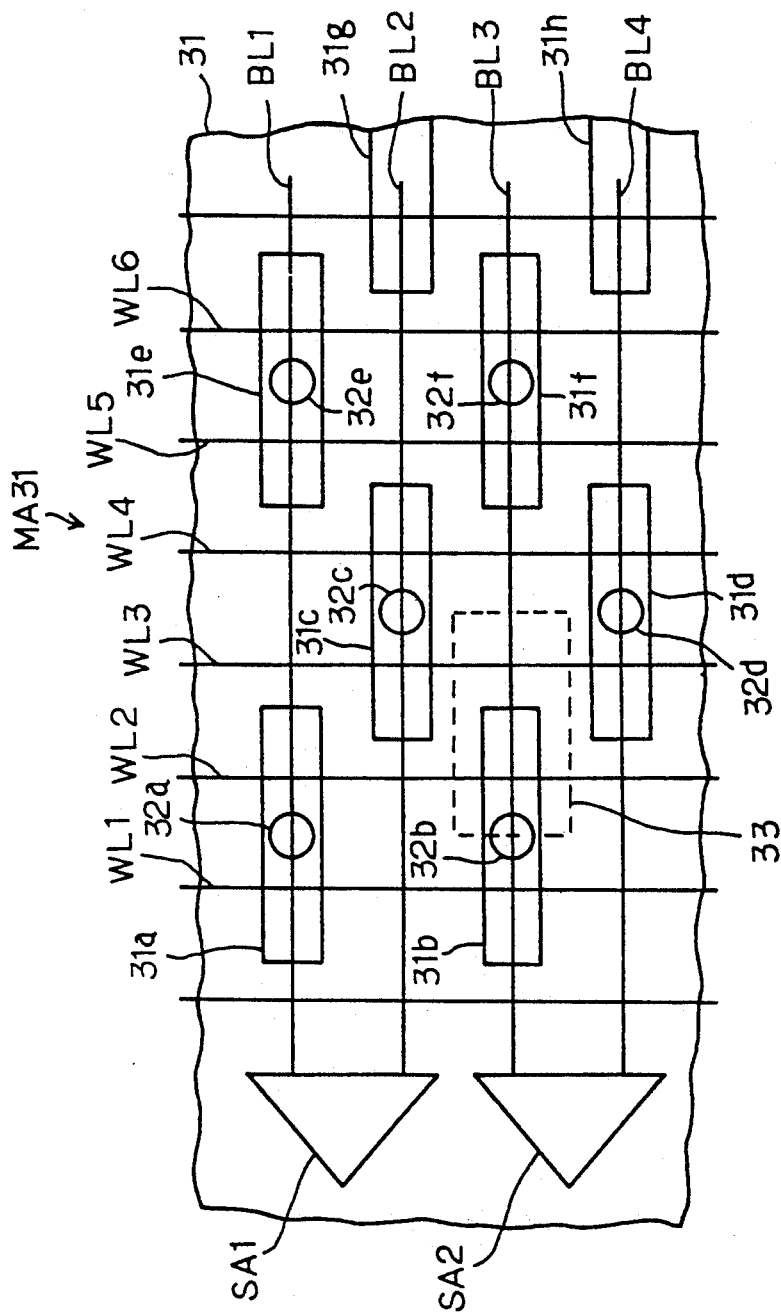
FIG. 3 is a view showing the arrangement of active areas for the memory cells of the memory cell matrix defined in the major surface of a semiconductor substrate.
Figure 4:
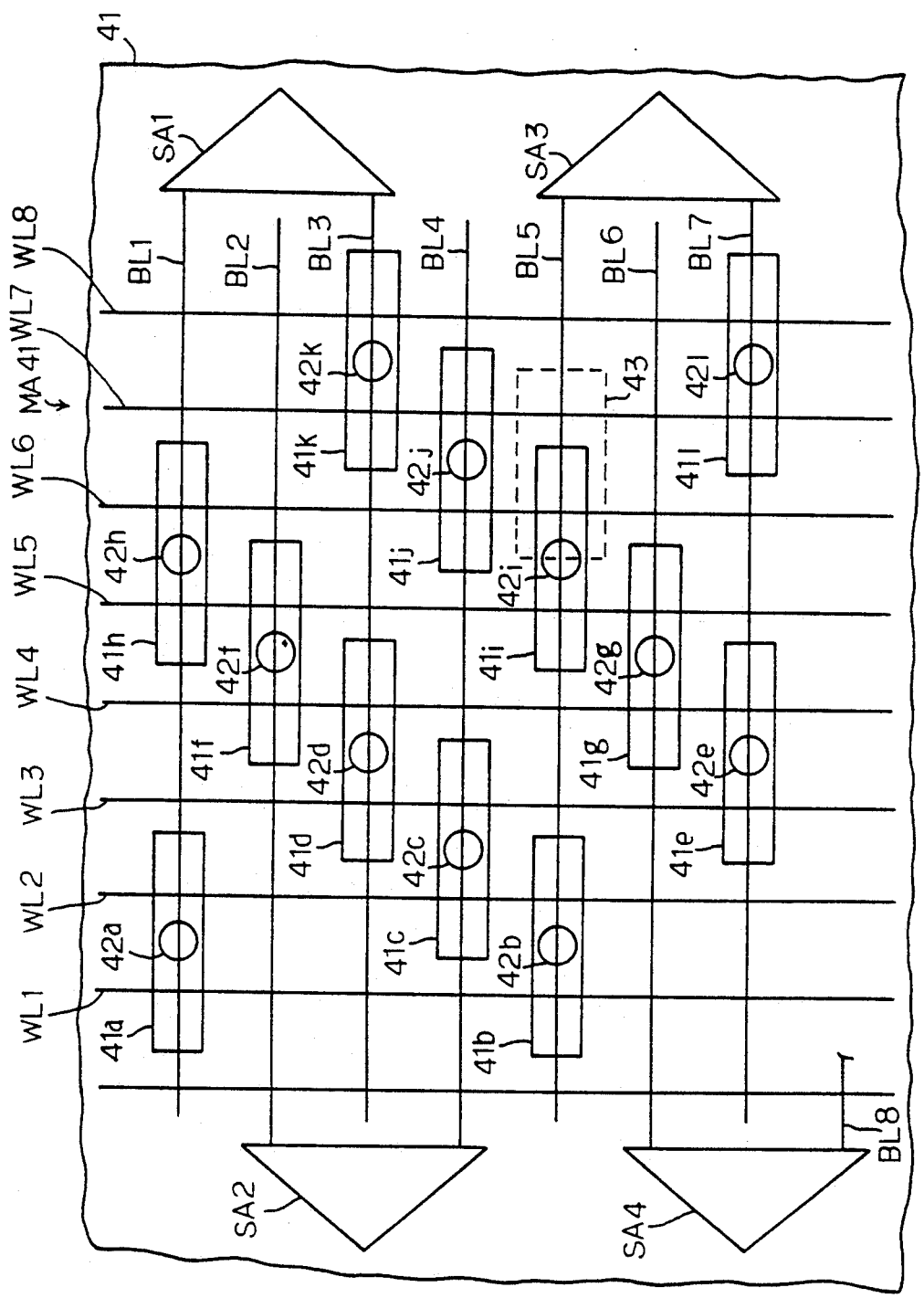
FIG. 4 is a view showing the arrangement of active areas of another prior art random access memory device.
Figure 5:
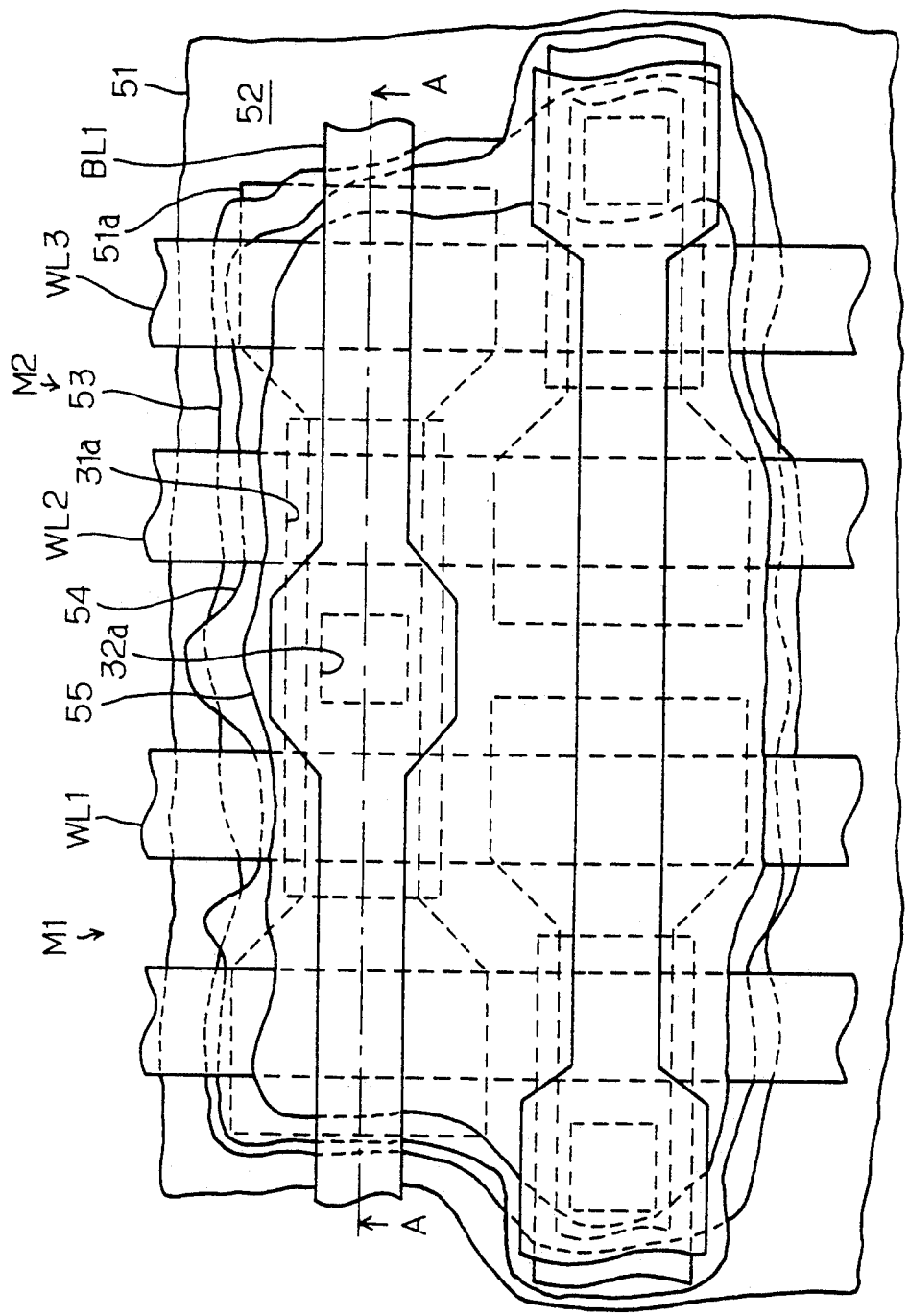
FIG. 5 is a plan view showing the structure of the prior art memory cell array shown in FIGS. 2 and 3 not larger than 1 mega-bits.
Figure 6:
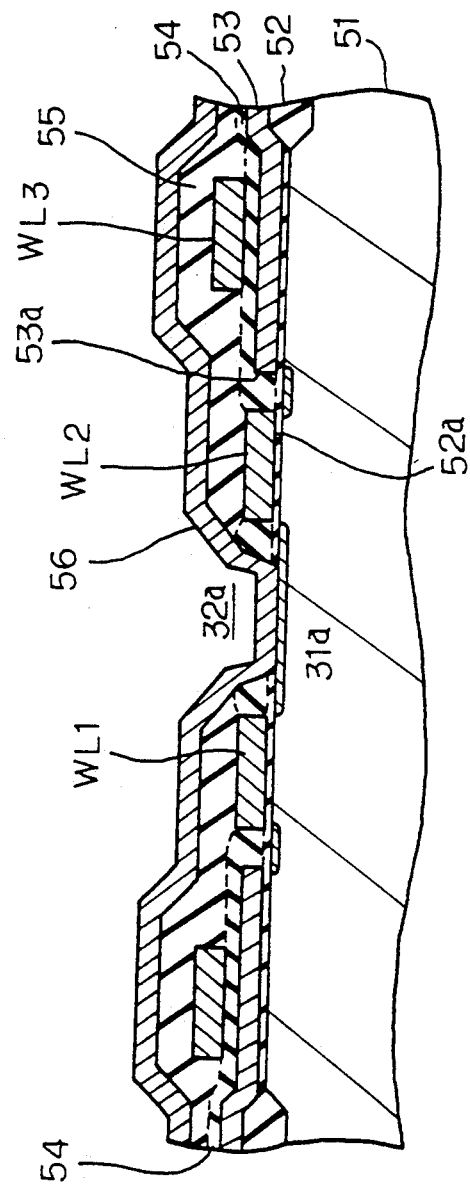
FIG. 6 is a cross sectional view taken along line A—A of FIG. 5 and showing the structure of adjacent two memory cells.
Figure 7:
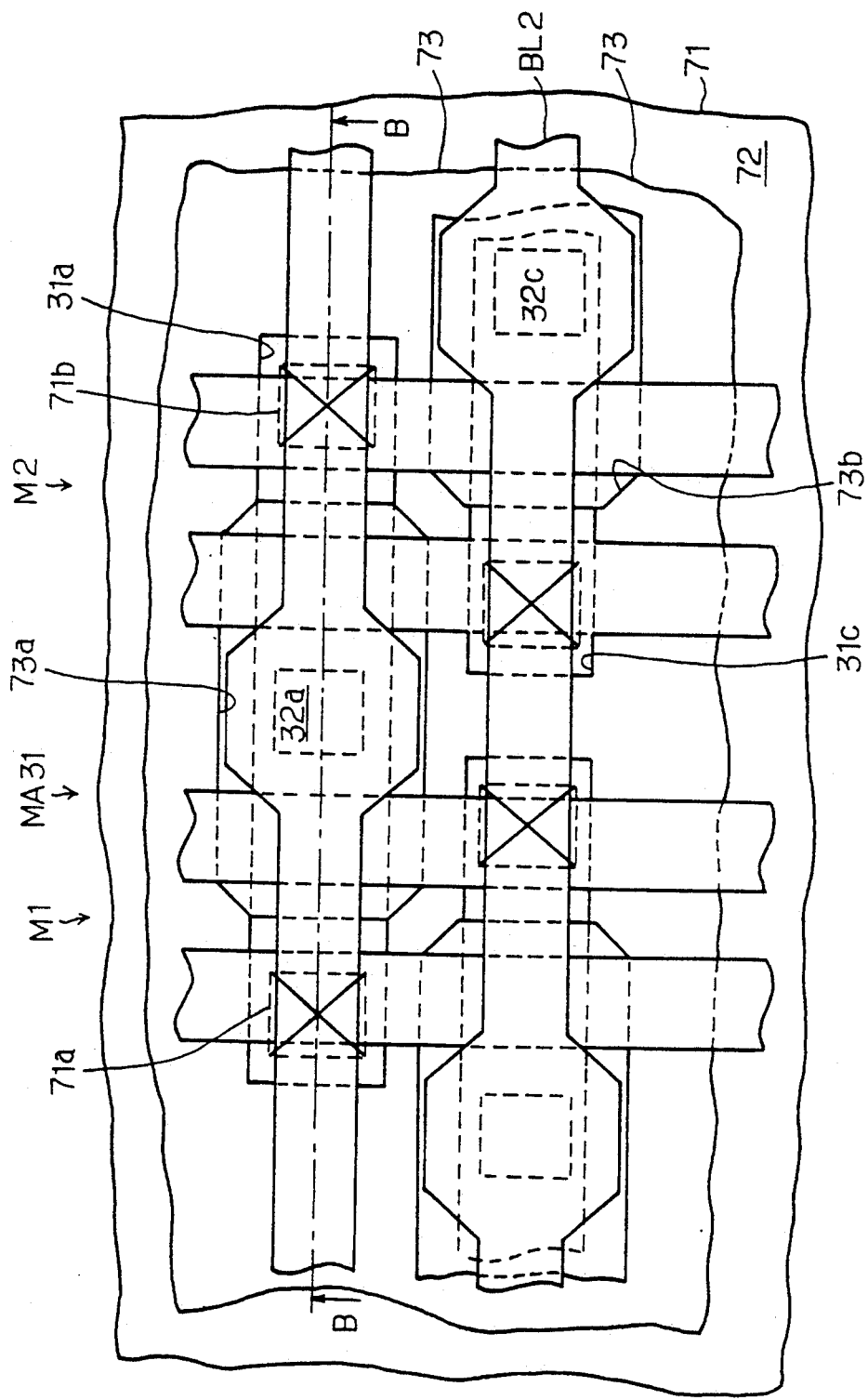
FIG. 7 is a plan view showing the structure of the prior art memory cell array shown in FIGS. 2 and 3 as large as 4 mega-bits.
Figure 8:
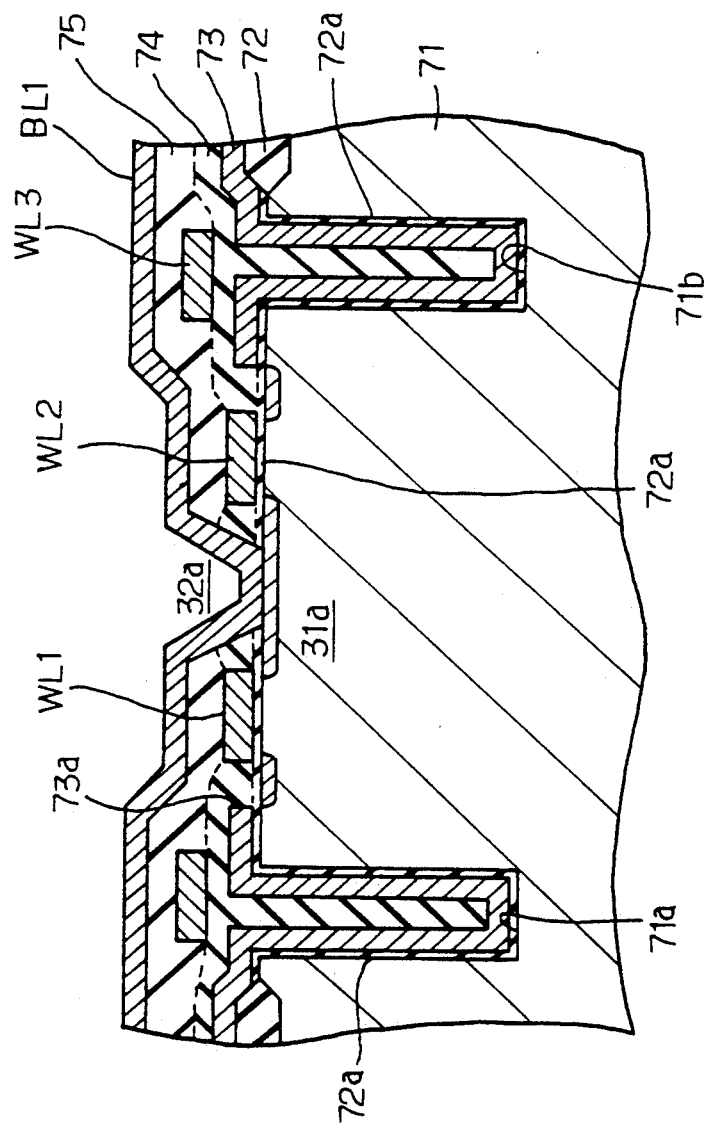
FIG. 8 is a cross sectional view taken along line B—B of FIG. 7 and showing the structure of adjacent two memory cells.
Figure 15:
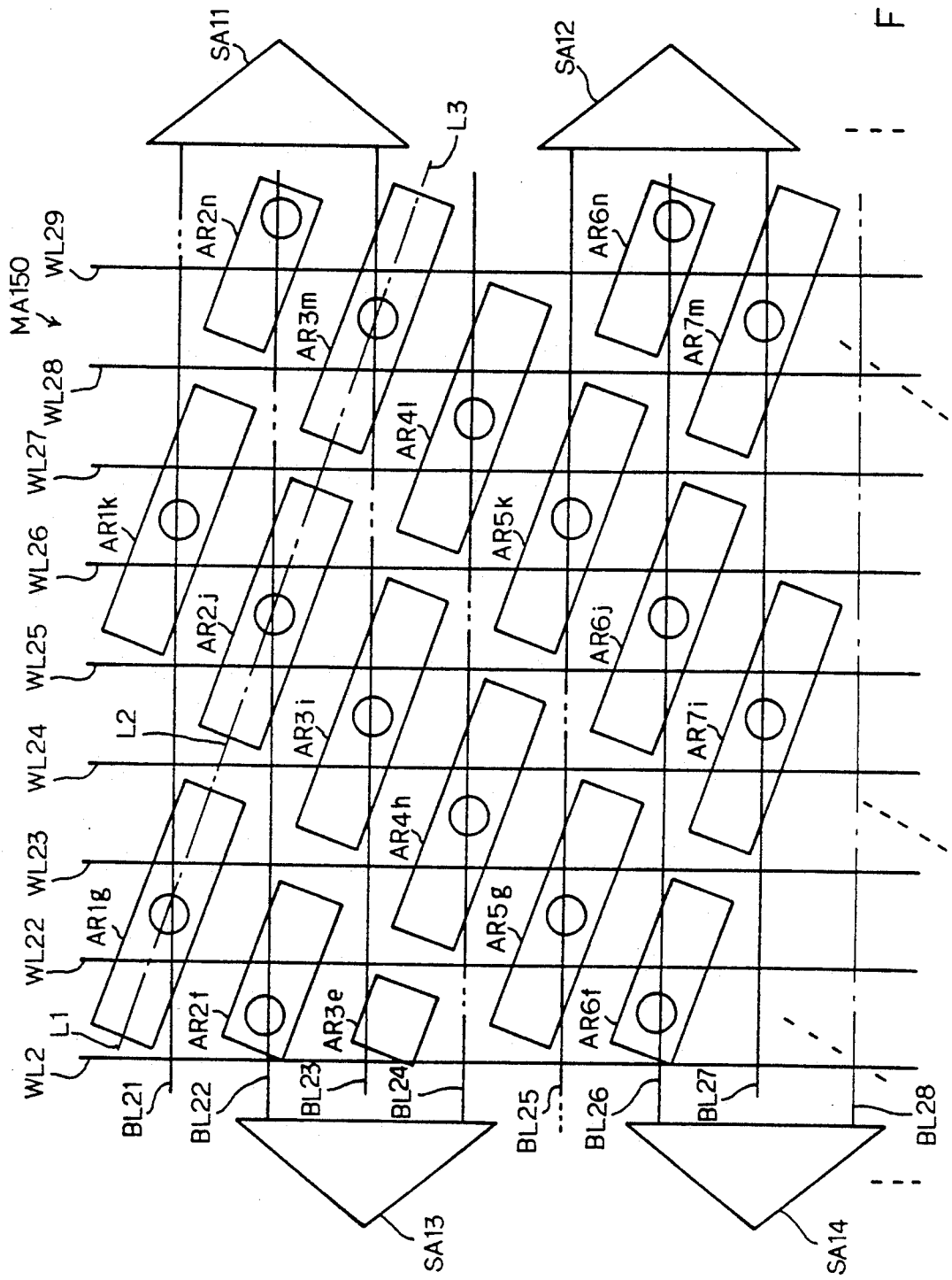
FIG. 15 is a view showing the arrangement of a memory cell array associated with bit lines and word lines according to the present invention.

Referring to FIG. 15 of the drawings, a memory cell array MA150 embodying the present invention is provided in association with word lines WL21, WL22, WL23, WL24, WL25, WL26, WL27, WL28 and WL29 as well as with bit lines BL21, BL22, BL23, BL24, BL25, BL26, BL27 and BL28. Although the memory cell array MA150 is supported by various peripheral circuits indispensable to a dynamic random access memory device, only four sense amplifier circuits SA11, SA12, SA13 and SA14 are shown in FIG. 15. The memory cell array MA150 is implemented by single-transistor single-capacitor type memory cells shown in FIG. 1, however, the storage capacitor CP1 may be coupled to a reference voltage source instead of the ground voltage source GND. In this instance, the sense amplifier circuits SA11 and SA12 form in combination a first sense amplifier group, and the other sense amplifier circuits SA13 and SA14 belong to a second sense amplifier group. Therefore, the bit lines BL21 and BL25 are respectively paired with the bit lines BL23 and BL27 so as to form first bit line pairs. Similarly, the bit lines BL22 and BL26 are respectively paired with the bit lines BL24 and BL28 so that second bit line pairs are terminated at the second sense amplifier group.

The memory cells incorporated in the memory cell array MA150 are arranged in rows and columns, and every adjacent two memory cells in each row form in combination a memory cell pair formed in a rectangular active area. Therefore, a plurality of rectangular active areas AR1g to AR1k, AR2f to AR2n, AR3e to AR3m, AR4h to AR4l, AR5g to AR5k, AR6f to AR6n and AR7i to AR7m are provided for the memory cell array MA150. If memory cells are coupled to a certain bit line, the memory cells are in the same row. The memory cells in the rectangular active areas AR1g to AR1k belong to the same row, by way of example. Similarly, if memory cells are coupled to a certain word line, the memory cells form one of the columns, and the memory cells in the rectangular active areas AR1g and AR5g, by way of example, belong to adjacent two columns respectively associated with the word lines WL22 and WL23.

The word lines WL21 to WL29 cross over the bit lines BL21 to BL28. However, the word lines WL21 to WL29 are electrically isolated from the bit lines BL21 to BL28 as will be described hereinafter. The rectangular active areas AR1g to AR7m have respective longitudinal directions each in parallel to the long sides thereof. For example, the longitudinal directions of the rectangular active areas AR1g, AR2j and AR3m are indicated by dot-and-dash lines L1, L2 and L3, respectively. The longitudinal directions of the rectangular active areas AR1g to AR7m obliquely extend with respect to the associated bit lines BL21 to BL28, and are substantially in parallel to one another.

Figure 16:
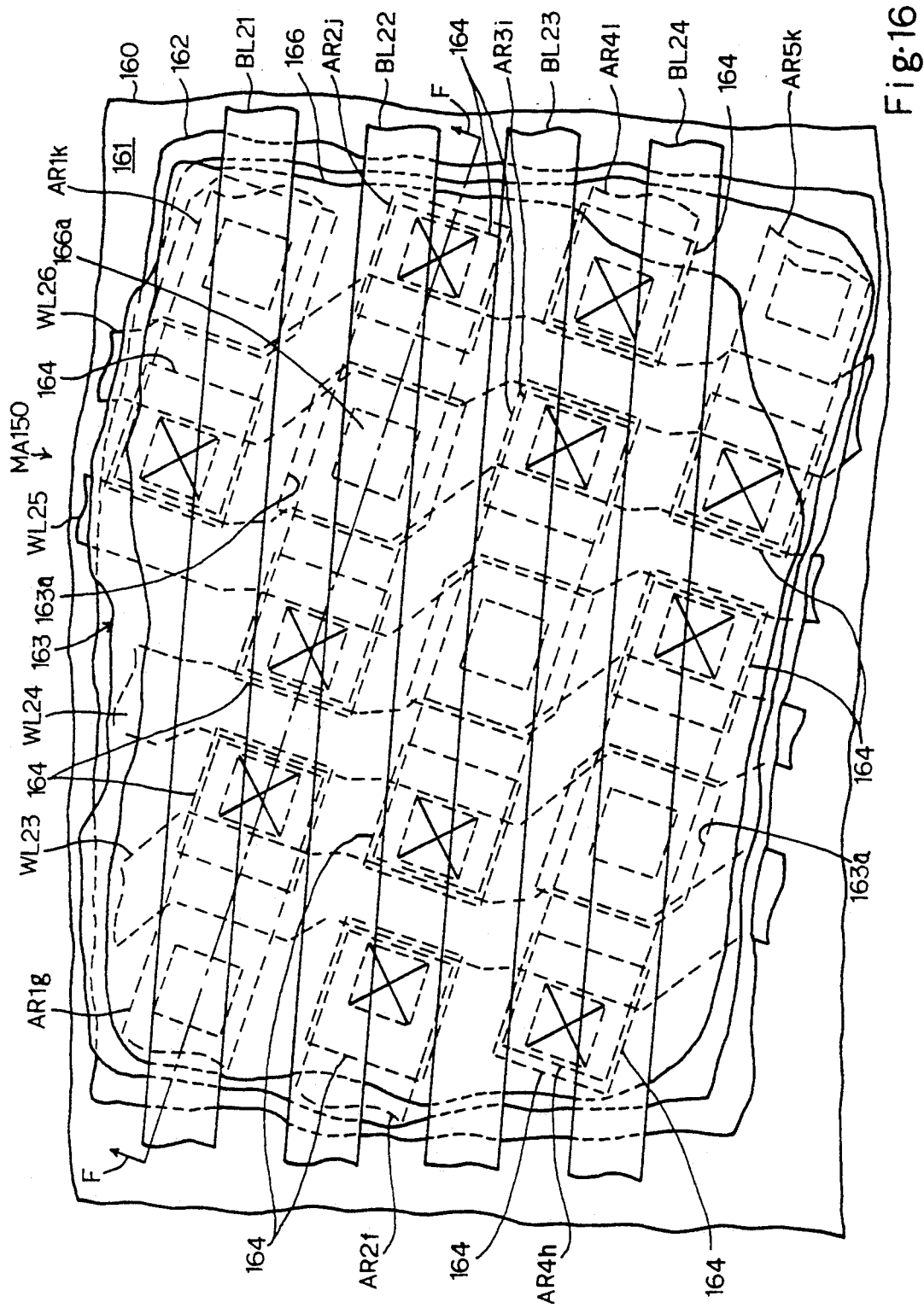
FIG. 16 is a plan view showing the structure of a part of the memory cell array shown in FIG. 15.
Figure 17:
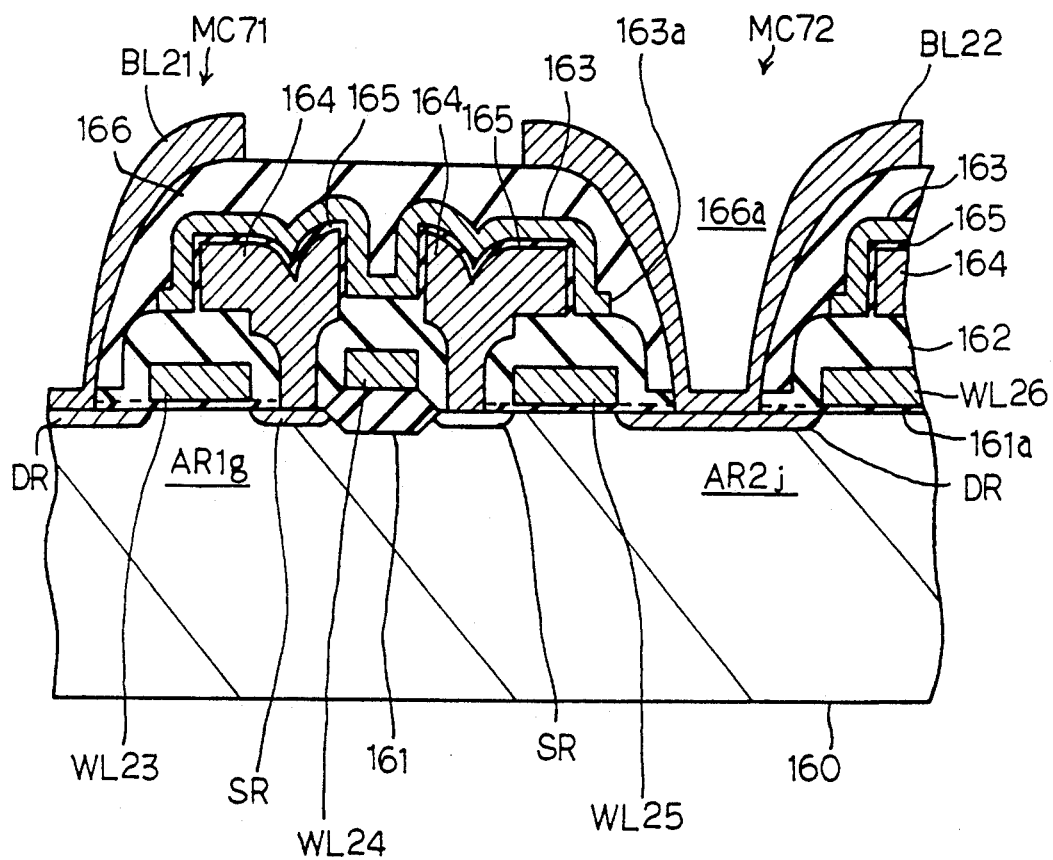
FIG. 17 is a cross sectional view taken along line F—F of FIG. 15 and showing the structure of adjacent two memory cells.

The structure of the memory cell array MA150 is illustrated in FIGS. 16 and 17, and the memory cell array MA150 is fabricated on a p-type silicon substrate 160. On the major surface of the silicon substrate 160 is selectively grown a thick field oxide film 161 which defines the rectangular active areas AR1g, AR1k, AR2f, AR2j, AR3i, AR4h, AR4l and AR5k in the major surface. The rectangular active areas AR1g to AR5k are selectively doped with n-type impurity atoms so that source regions SR and drain regions DR are formed for the switching transistors of memory cells MC71 and MC72. A thin gate oxide film 161a is grown on the rectangular active areas AR1g to AR5k, and the word lines WL23 to WL26 fall from the thick field oxide film 161 onto the thin gate oxide film 161a for providing gate electrodes of the switching transistors. In this instance, the word lines WL23 to WL26 follow respective zigzag courses, and pass through between the rectangular active areas. The word lines WL23 to WL26 are overlain by a first inter-level oxide film 162, and contact holes formed in the first inter-level oxide film 162 reach the drain regions DR. In order to clearly indicate the locations, the contact holes in the first inter-level oxide film 162 are marked with "X" in FIG. 16. Accumulating electrodes 164 of storage capacitors are formed on the first-inter-level oxide film 162, and reach the source regions DR through the contact holes marked with "X". Thin dielectric films 165 cover the accumulating electrodes 164, respectively, and a counter electrode 163 is held in contact with the dielectric films 165. Since the counter electrode 163 is shred between a plurality of memory cells, apertures 163a of the counter electrode 163 allow the bit lines such as BL22 to pass through a contact hole 166a formed in a second inter-level oxide film 166 so as to be held in contact with the drain regions DR.

Figure 9:
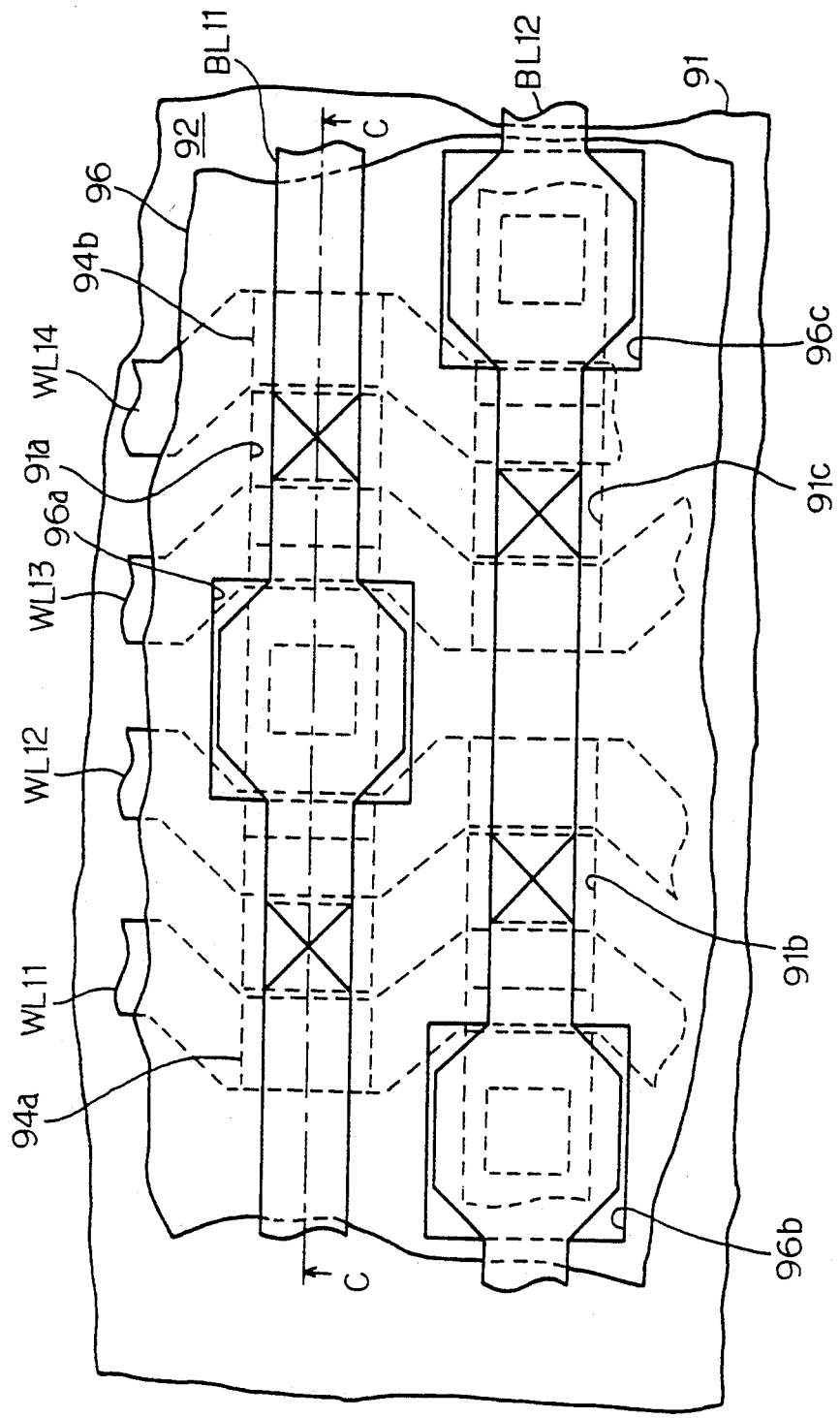
FIG. 9 is a plan view showing the structure of another prior art random access memory cells with stacked storage capacitors.
Figure 10:
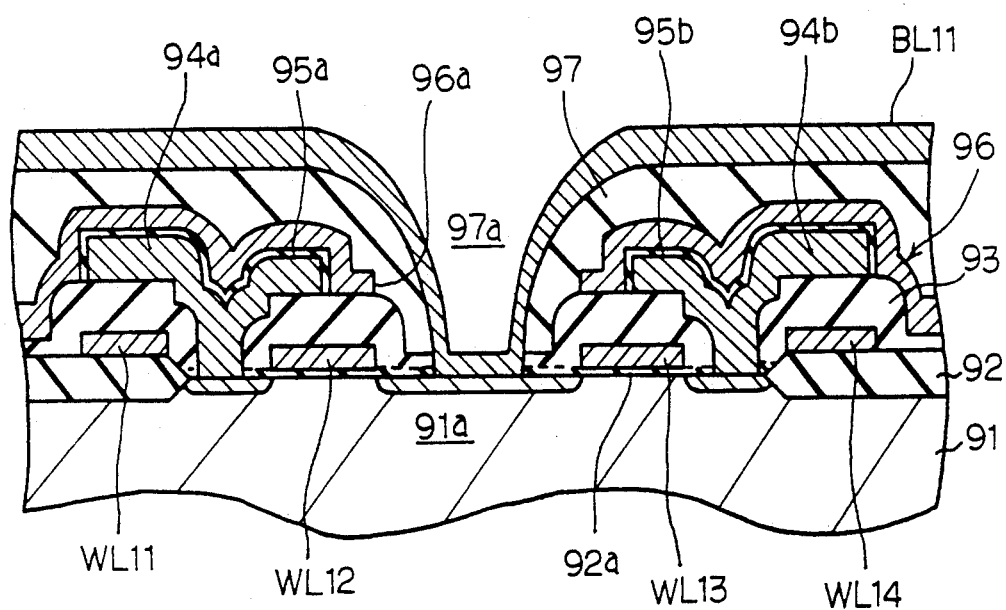
FIG. 10 is a cross sectional view taken along line C—C of FIG. 9 and showing the structure of adjacent two memory cells.

The memory cell arrangement according to the present invention can effectively decrease the amount of vacancy in the major surface of the silicon substrate 160. The design rules used for the first embodiment are identical with those used for the prior art dynamic random access memory device shown in FIGS. 9 and 10 where the memory cell size is 1.5 microns by 3.0 microns, the pitch of word lines is 1.5 microns and the pitch of bit lines is 1.5 microns. Namely, the unit length for the gate of switching transistors is 0.7 micron, the minimum gate width is 0.9 micron, the minimum width of the thick field oxide film is 0.6 micron, the minimum dimensions for the conductive wiring strip are 0.6 micron applicable for both width and gap between adjacent two wiring strips, the minimum dimensions of a contact hole are 0.6 micron by 0.6 micron, and a unit area for the active areas measures 0.9 micron by 0.9 micron.

In the first embodiment, the longitudinal direction of each rectangular active area is substantially aligned with that of a predetermined rectangular active area spaced apart therefrom by three pitches of word line and a single pitch of bit line. For example, the longitudinal direction of the rectangular active area AR1g is substantially aligned with that of the rectangular active area AR2j. In the first embodiment, the long side of each rectangular active area is spaced apart from the long side of the adjacent rectangular active area by the thick field oxide film 161 with the minimum width. In this arrangement, the following equations are established.

$$\sin A = (c+d)/4a \qquad \ldots \text{Equation 1}$$

$$\tan A = b/3a \qquad \ldots \text{Equation 2}$$

where a is indicative of the pitch of word lines, b is indicative of the pitch of bit lines, c is indicative of the short side of the rectangular active area, d is indicative of the minimum width of thick field oxide film, and A is indicative of the sharp angle between the longitudinal direction of the rectangular active area and the associated bit line. In the trigonometric function, tan A is ( sin A/cos A ), and cos A is $(1-\sin^2 A)^{\frac{1}{2}}$, and Equations 1 and 2 are modified as $$\begin{aligned} b &= 3 \tan A = 3a \sin A \ (1 - \sin^2 A)^{-\frac{1}{2}} \\ &= \{3a \ (c + d)/4a\} \ [1 - \{(c + d)/4a\}^2]^{-\frac{1}{2}} \\ &= \{3(c + d)/4\} \ [1 - \{(c + d)/4a)^2]^{-\frac{1}{2}} \end{aligned} \qquad \text{Equation 3}$$

As described above, c is 0.9 micron, d is 0.6 micron, and a is 1.5 microns. Substitution results in that b is 1.16 micron. However, the above mentioned design rules define that the minimum width and the minimum gap are 0.6 micron, and, for this reason, the pitch of bit lines of 1.2 micron is applied to the first embodiment. Thus, the pitch of bit lines is decreased in comparison with the prior art random access memory device. Moreover, each word line follows a zigzag course so as to pass through between two rectangular active areas substantially aligned with one another, and the rectangular active areas allow the thick field oxide film 161 to be patterned in the minimum width. For this reason, the rectangular active areas AR1g to AR7m form a regular pattern, and each rectangular active area is spaced apart from the adjacent four rectangular active areas by the minimum distance. This results in that no vacancy is necessary for the word lines WL21 to WL29. In fact, the memory cell array MA150 is decreased in occupation area to 80% of the prior art memory cell array shown in FIGS. 9 and 10. Another advantage of the present invention is compatibility of fabrication process. As described hereinbefore, the design rules of the first embodiment are identical with those of the prior art random access memory device, and the manufacturing facility for the prior art random access memory device is available for the random access memory device implementing the first embodiment.

As will be seen from FIG. 16, each accumulating electrode slightly projects from the outer periphery of the associated rectangular active area, however, the thickness thereof is increased so as to compensate the surface thereof. Such a thick accumulating electrode allows decreasing the real estate occupied by the storage capacitor without reduction of the capacitance.

Tables 1 and 2 compares the dynamic random access memory device implementing the first embodiment with the prior art random access memory device.

TABLE 1

| | 1st Embodiment | |
|---|---|---|
| | X | Y |
| Memory Cell Size | 3.0 μm | 1.2 μm |

TABLE 1-continued

| | 1st Embodiment | |
|---|---|---|
| | X | Y |
| Arrangement of Array | 4096 (div. into 16) | 4096 |
| Dimensions of Array | 12288 μm | 4915.2 μm |
| Area for Array | 60397977.6 μm² | |
| Sense Amp. Size | 140 μm | 4.8 μm |
| Arrangement of Amp. | 32 (16 × 2) | 1024 (4096/4) |
| Dimensions of Amp. | 4480 | 4915.2 |
| Area for Amplifiers | 22020096 μm² | |

TABLE 2

| | Prior Art | |
|---|---|---|
| | X | Y |
| Memory Cell Size | 3.0 μm | 1.5 μm |
| Arrangement of Array | 4096 (div. into 16) | 4096 |
| Dimensions of Array | 12288 μm | 6144 μm |
| Area for Array | 75497472 μm² | |
| Sense Amp. Size | 140 μm | 3.0 μm |
| Arrangement of Amp. | 16 | 2048 (4096/2) |
| Dimensions of Amp. | 2240 | 6144 |
| Area for Amplifiers | 13762560 μm² | |

In Tables 1 and 2, "x" and "y" stand for directions perpendicular to each other, and "x" is aligned with the longitudinal direction of the semiconductor chip as well as with the longitudinal direction of the memory cell. The advantages of the first embodiment are summarized in Table 3.

TABLE 3

| First Embodiment | |
|---|---|
| Dimensions of Array | y direction: decrease of 1228.8 μm |
| Area for Array | decrease of 15099494.4 μm² |
| Dimensions of Amp. | x direction: increase of 2240 μm |
| Area for Amplifiers | increase of 8257536 μm² |

Table 3 teaches that the dynamic random access memory device implementing the first embodiment is decreased in "y" direction by about 1.2 millimeters and increased in "x" direction by about 2.2 millimeters, thereby being decreased in area by about 7 square-millimeter.

In the first embodiment, the pitch of sense amplifiers is 1.6 times larger than that of the prior art. However, if the layout of the component circuit elements of the sense amplifier circuit is modified, the sense amplifier circuit may be shrunk in "x" direction. Moreover, if the adjacent sense amplifier circuits share parts of the component circuit elements as disclosed in "A45-ns 16 Mbit DRAM Triple-Well Structure", IEEE-SSC 1989 October, vol. 24, No. 5, pages 1170 to 1175, the increment of area for each sense amplifier circuit is restricted. However, the sense amplifier circuit 1.6 times larger than that of the prior art is surely improved in sensitivity.

The first embodiment is compared with one of the prior art dynamic random access memory devices; however, there are the similar advantages over the other prior art dynamic random access memory devices.

Second Embodiment

Figure 18:
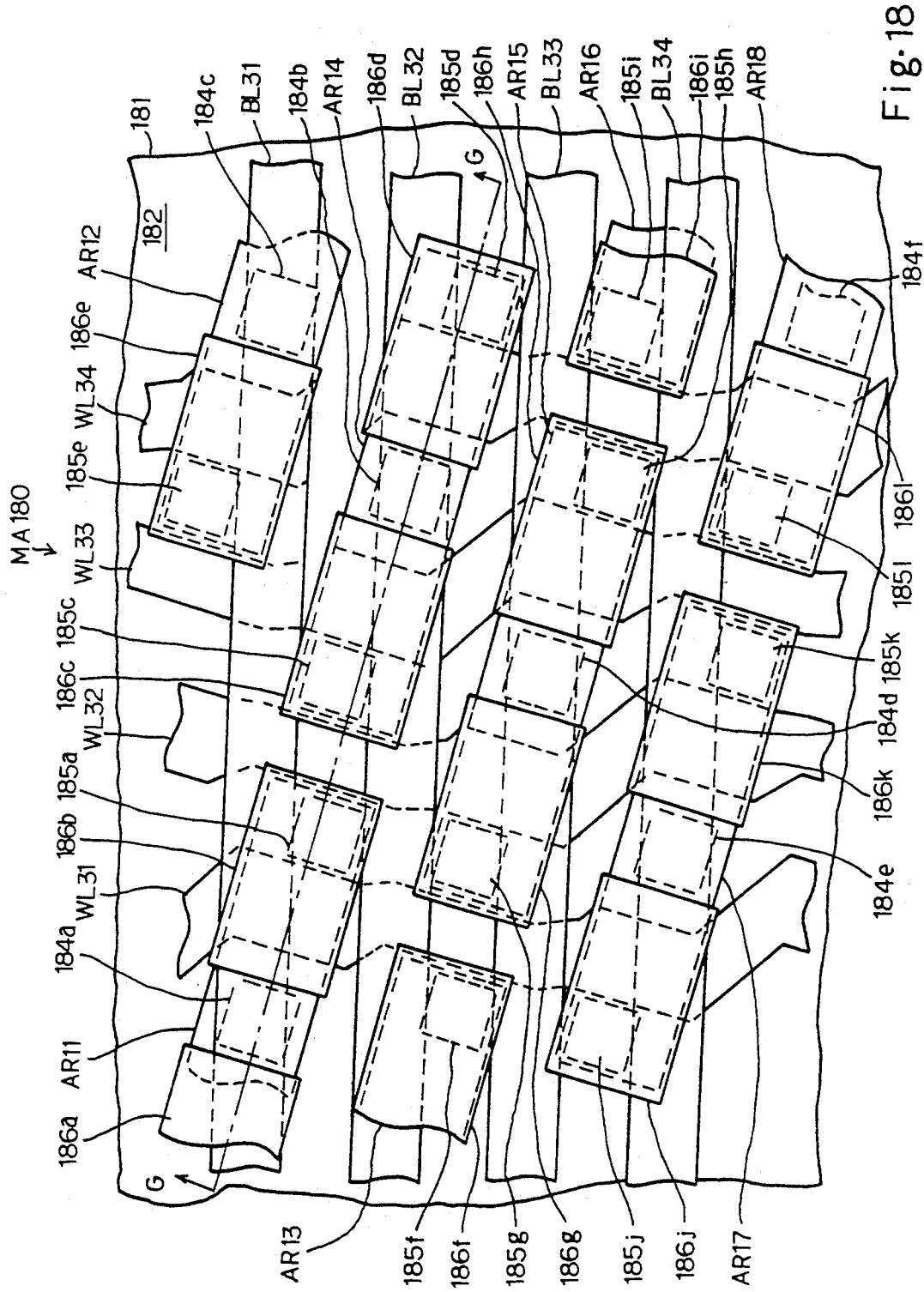
FIG. 18 is a plan view showing the structure a part of another memory cell array associated with bit lines and word lines according to the present invention.
Figure 19:
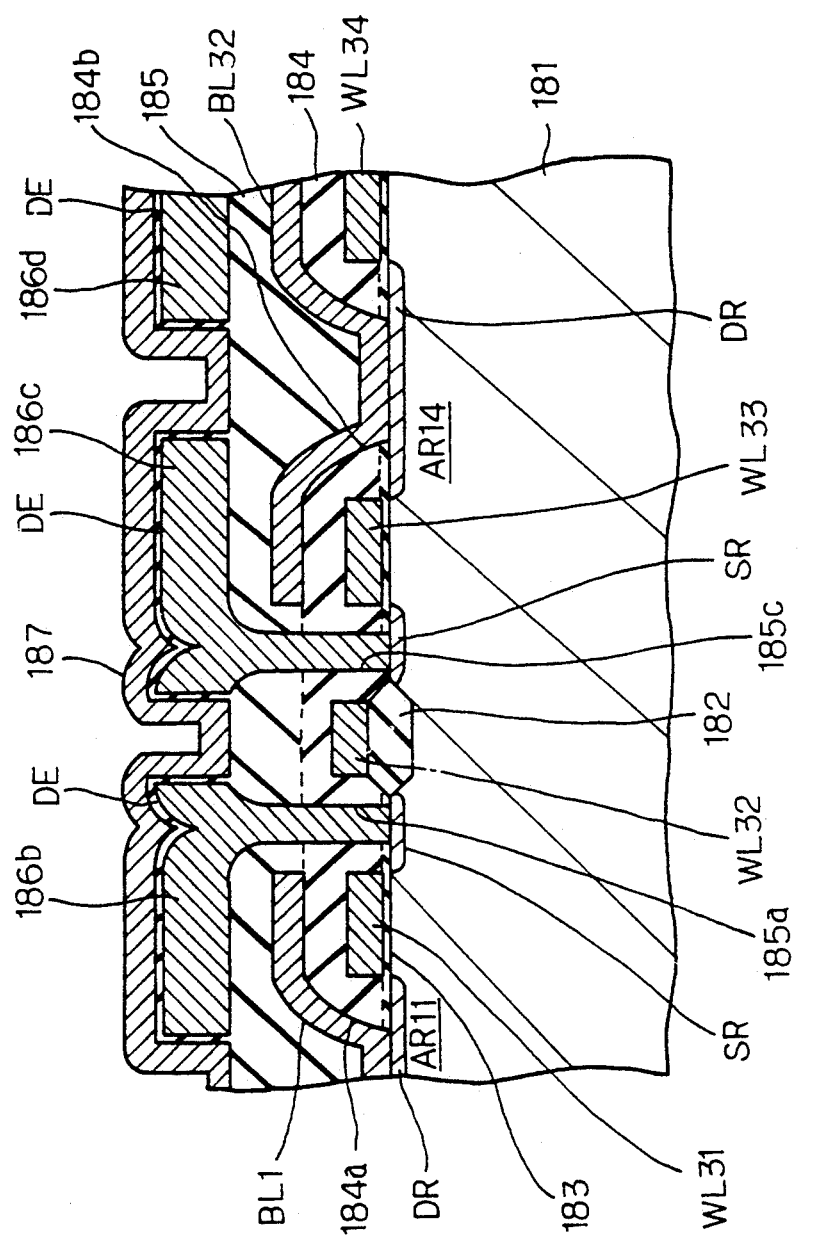
FIG. 19 is a cross sectional view taken along line G—G of FIG. 18 and showing the structure of adjacent two memory cells.

Turning to FIG. 18 and 19, another memory cell array MA180 is fabricated on a p-type silicon substrate 181. Although inter-level film structure and a counter electrode shared between storage capacitors are provided in the memory cell array MA180, they are omitted from FIG. 18 for the sake of simplicity. A thick field oxide film 182 is selectively grown on the major surface of the silicon substrate 181, and rectangular active areas AR11 to AR18 are defined by the thick field oxide film 182. N-type impurity atoms are selectively introduced in the rectangular active areas AR11 to AR18 so that source and drain regions SR and DR are formed in the rectangular active areas AR11 to AR18. A thin gate oxide film 183 is grown on the active areas AR11 to AR18, and word lines WL31 to WL34 extend from the thick field oxide film 182 to the thin gate oxide film 182 so as to provide gate electrodes of switching transistors. A first inter-level oxide film 184 covers the word lines WL31 to WL34, and bit lines BL31 to BL34 are held in contact with the drain regions DR through contact holes 184a to 184f formed in the first inter-level oxide film 184. The bit lines BL31 to BL34 are overlain by a second inter-level oxide film 185, and contact holes 185a to 185l are formed in the first and second inter-level oxide films 184 and 185. Accumulating electrodes 186a to 186l passes through the contact holes 185a to 185l, and reach the source regions SR, respectively. Dielectric films DE cover the accumulating electrodes 186a to 186l, and the counter electrode 187 is provided on the dielectric films DE.

Figure 11:
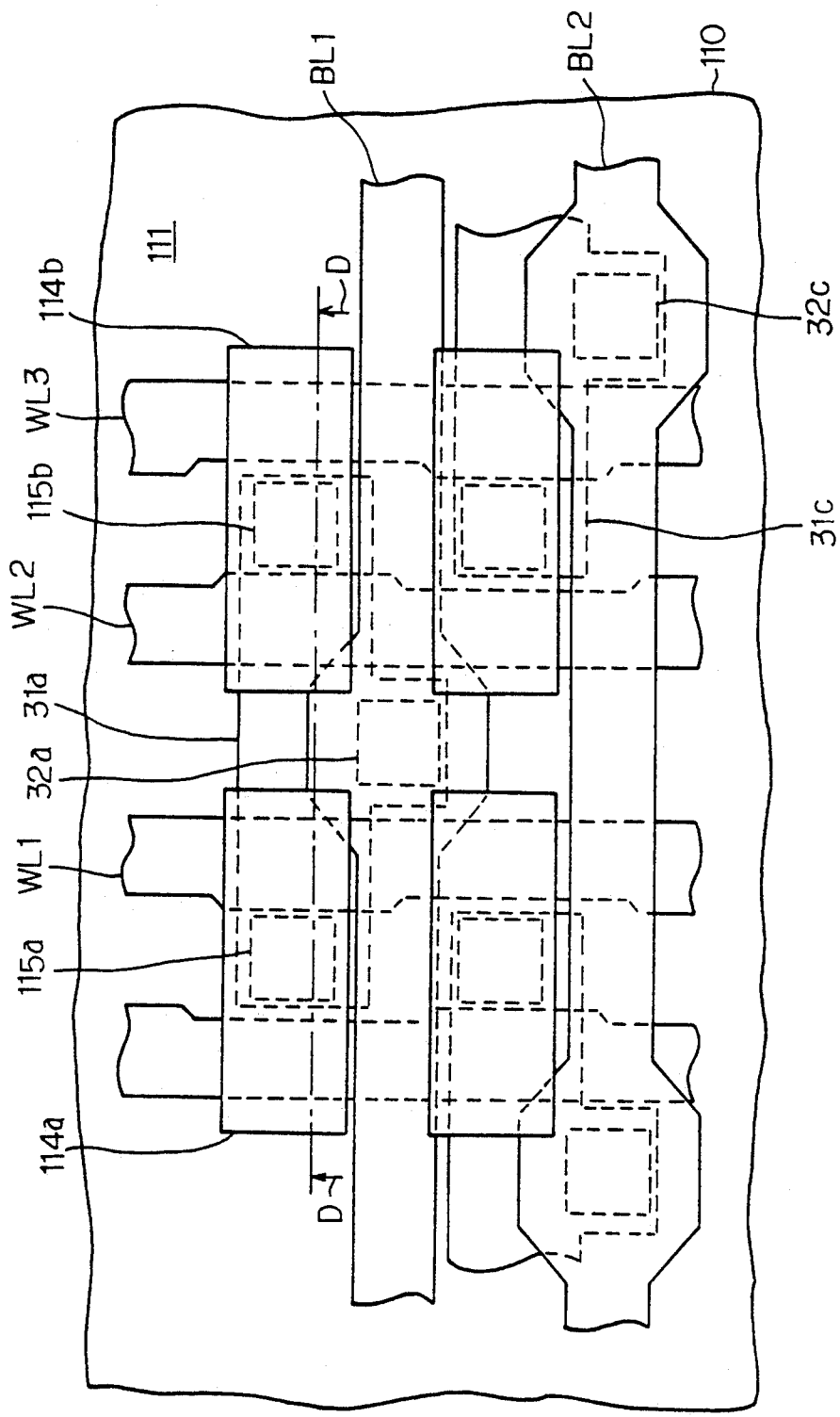
FIG. 11 is a plan view showing the structure of the random access memory cell array shown in FIGS. 2 and 3 in a case where the memory cell array is increased to 16 mega-bits.
Figure 12:
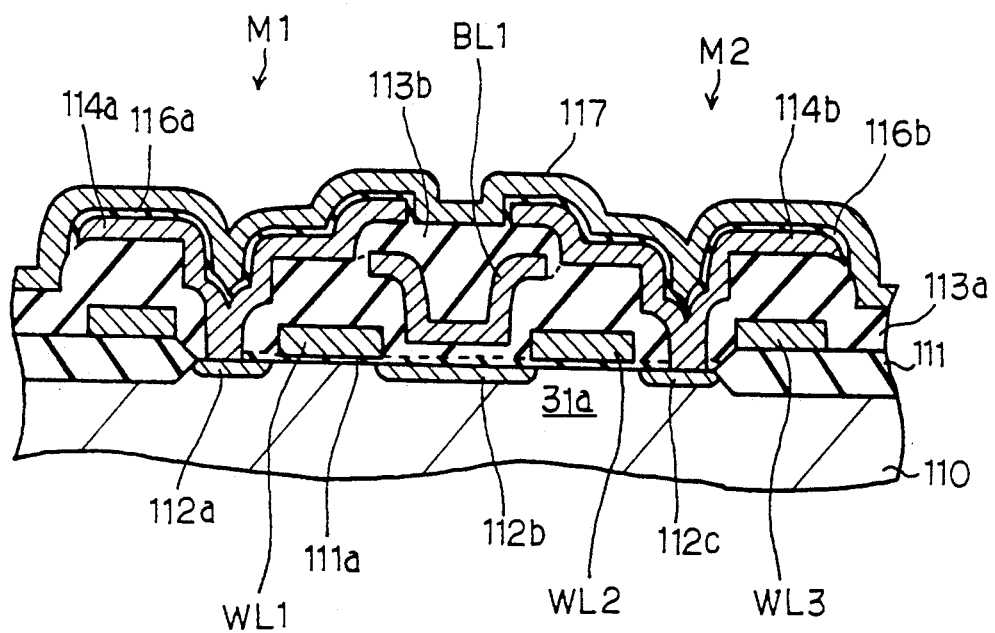
FIG. 12 is a cross sectional view taken along line D—D of FIG. 11 and showing the structure of adjacent two memory cells.
Figure 13:
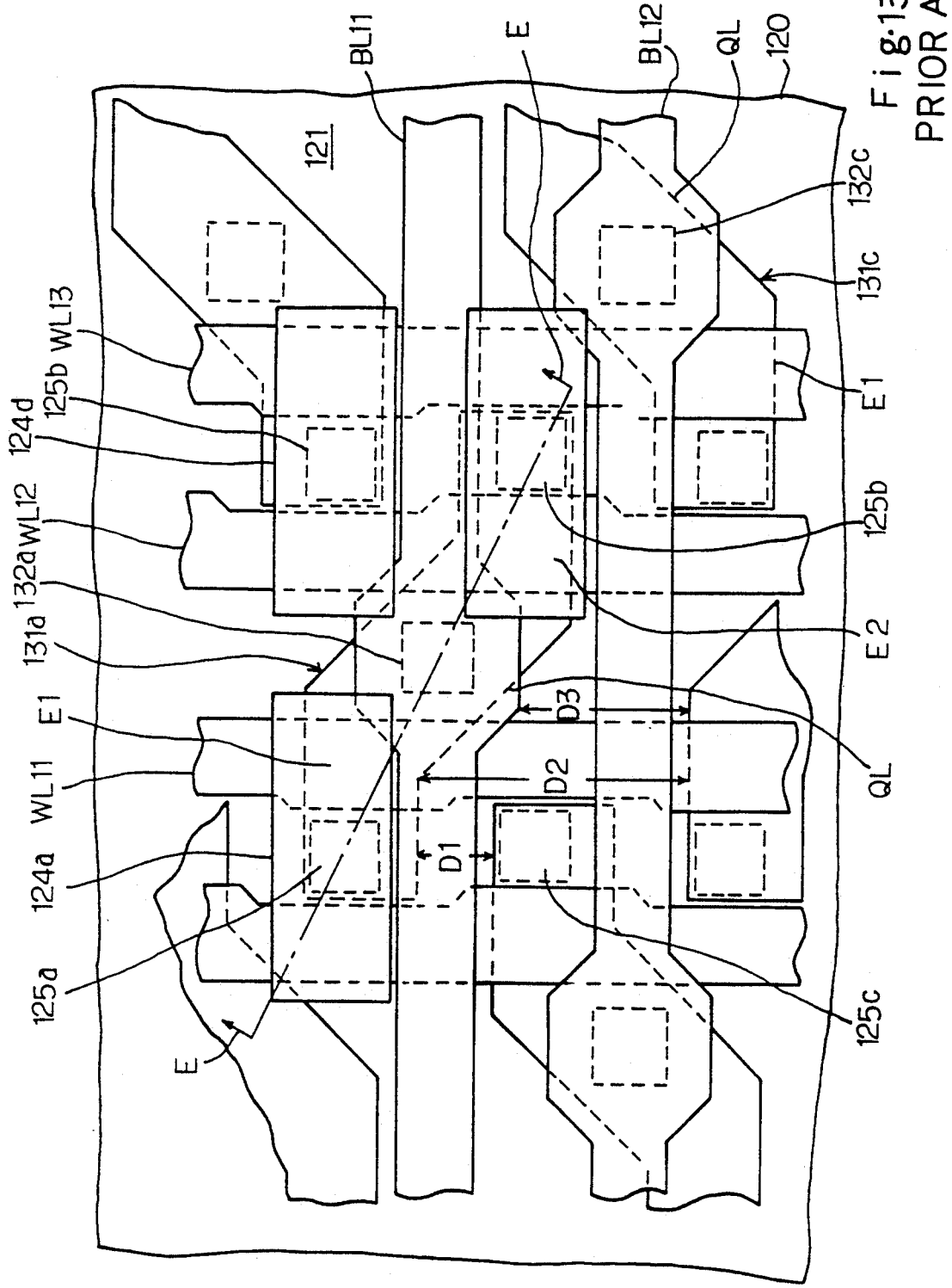
FIG. 13 is a plan view showing the structure of another prior art 16 mega-bit random access memory device.
Figure 14:
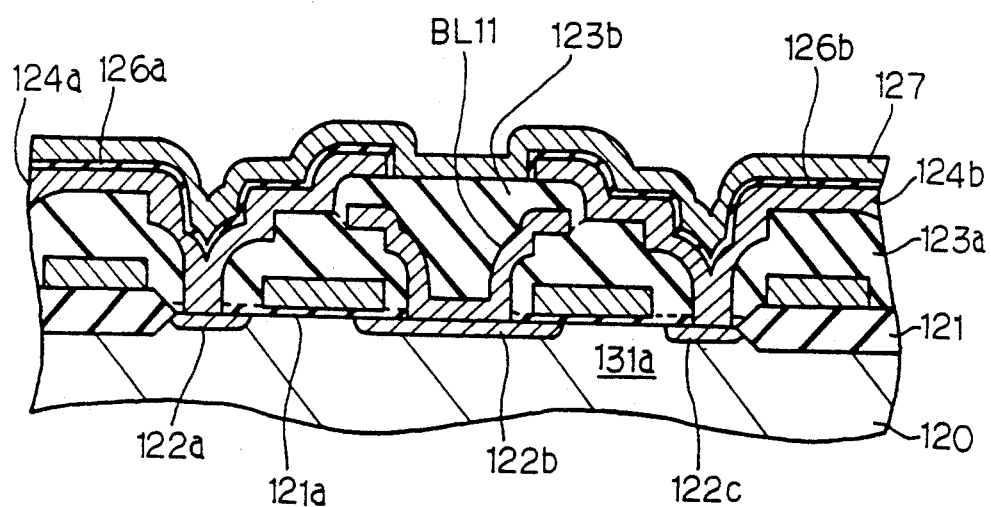
FIG. 14 is a cross sectional view taken along line E—E of FIG. 13 and showing the structure of adjacent two memory cells.

The storage capacitors incorporated in the memory cell array MA180 are similar to those of the prior art dynamic random access memory device shown in FIGS. 11 and 12, and the contact holes 185a to 185l need to pass through between the word lines WL31 to WL34 and the bit lines BL31 to BL34. The rectangular active areas AR11 to AR18 are arranged in such a manner as to be oblique with respect to the associated bit lines BL31 to BL34 as similar to the first embodiment, and the contact holes 185a to 185l are suitably located without any rearrangement of the word lines WL31 to WL34 and the bit lines BL31 to BL34. However, in the prior art dynamic random access memory devices shown in FIGS. 11/12 and 13/14, the active areas 31a/31c and 131a/131c and the word lines WL1/WL2/ WL3 and WL11/ WL12/WL13 are formed into different configurations from those shown in FIGS. 9 and 10 so as to form the contact holes between the bit lines BL1/BL2 and BL11 and BL12, and the fabricating process is also changed. Moreover, the configurations different from the rectangle make the distances between the contacts and the word lines small, and the bit lines and the word lines are much more likely to short-circuit. This is because of the fact that the active areas are substantially parallel to the bit lines. Moreover, the accumulating electrodes 186a to 186l are provided over the bit lines BL31 to B134, and it is not necessary to take any margin 9 between the accumulating electrodes and the contact holes 185a to 185l into account. This results in an increase of the capacitance of the storage capacitor. Thus, the present invention achieves not only reduction of chip size but also increase in capacitance.

As will be understood from the foregoing description, by virtue of the generally rectangular active areas obliquely extending with respect to the bit lines, the vacancies at crossing points of the word lines and the bit lines are minimized. The present invention is advantageous over the prior art dynamic random access memory cell arrays in that the area occupied by the memory cell array is decreased without a corresponding reduction of the component transistor size. Moreover, the field oxide film is decreased together with the pitch of bit lines and the length of the sense amplifier circuit perpendicular to the pitch of bit lines can be decreased.

Although particular embodiments of the present invention have been shown and described, it will be obvious to those skilled in the art that various changes and modifications may be made without departing from the spirit and scope of the present invention. For example, the arrangement according to the present invention may be applied to another semiconductor memory device characterized by, for example, a trench type storage capacitor. The dielectric film of the storage capacitor may be replaced with a composite dielectric film structure. Moreover, the active areas of the embodiments are shaped into rectangles, however, a generally rectangular active area may be defined by a thick field oxide film.

What is claimed is:

1. A semiconductor memory device fabricated on a single semiconductor chip, comprising:
   a) a plurality of first word line pairs each formed by adjacent two first word lines;
   b) a plurality of first bit lines respectively paired with a plurality of second bit lines for forming a plurality of bit line pairs respectively coupled with a plurality of first sense amplifier circuits located on one side of said plurality of bit line pairs;
   c) a plurality of first memory cell pairs arranged in rows and columns, said rows of said plurality of first memory cell pairs being selectively coupled to said first and second bit lines, said columns of said plurality of first memory cell pairs being respectively formed in a plurality of generally rectangular first active areas having respective longitudinal directions obliquely extending with respect to longitudinal directions of said associated first and second bit lines, respectively, said longitudinal directions of said generally rectangular first active areas being substantially in parallel to one another;
   d) one of said adjacent two word lines of one of said plurality of first word line pairs and one of said adjacent two word lines of another of said plurality of first word line pairs adjacent to each other forming a second word line pair, so that said word lines of said plurality of first word line pairs are rearranged into a plurality of second word line pairs;
   e) a plurality of third bit lines respectively paired with a plurality of fourth bit lines for forming a plurality of second bit line pairs respectively coupled with a plurality of second sense amplifier circuits located on an opposite side of said plurality of first sense amplifier circuits, said third and fourth bit lines being interdigitated between said first and second bit lines so as to form a folded-bit-line configuration; and
   f) a plurality of second memory cell pairs arranged in rows and columns, said rows of said second memory cell pairs being interdigitated with said rows of said first memory cell pairs, said rows of said second memory cell pairs being coupled with said plurality of second word lien pairs for selectively conducting with said third and fourth bit lines, said second memory cell pairs being respectively formed in a plurality of generally rectangular second active areas having respective longitudinal directions obliquely extending with respect to longitudinal directions of said associated third and fourth bit lines, respectively, said longitudinal directions of said generally rectangular second active areas being substantially in parallel to one another and substantially aligned with said longitudinal directions of said generally rectangular first active areas in such a manner that said generally rectangular first active areas and said generally rectangular second active areas are alternately arranged, the oblique angle between said longitudinal directions and said bit lines being adjusted in such a manner that each of said word lines extends over a field insulating film between one of said generally rectangular first active areas and one of said generally rectangular second active areas adjacent to each other in said longitudinal directions thereof.

2. A semiconductor memory device fabricated on a single semiconductor substrate, comprising:
   a) a plurality of memory cells arranged in rows and columns and respectively storing data bits, every adjacent two memory cells in one of said rows forming a memory cell pair formed in a generally rectangular active area so that said plurality of memory cells are formed in a plurality of generally rectangular active areas, a bit-line contact hole formed over a central area of each of said generally rectangular active areas being shared between every adjacent two memory cells;
   b) a plurality of bit lines respectively coupled through the bit-line contact holes to said rows of said plurality of memory cells for propagating data bits read-out from one of said memory cells coupled thereto, every other bit line selected from said plurality of bit lines forming a first bit line group, the remaining bit lines of said plurality of bit lines forming a second bit line group, said first bit line group being terminated at a first sense amplifier group located on a first side of said plurality of bit lines, every adjacent two bit lines of said first bit line group terminated at said first sense amplifier group forming a first bit line pair, said second bit line group being terminated at a second sense amplifier group located on a second side of said plurality of bit lines opposite to said first side, every adjacent two bit lines of said second bit line group terminated at said second sense amplifier group forming a second bit line pair, said generally rectangular active areas having respective longitudinal directions obliquely extending with respect to longitudinal directions of said plurality of bit lines, said longitudinal directions of said generally rectangular active areas being substantially in parallel to one another; and
   c) a plurality of word lines crossing said plurality of bit lines without electrical connection and respectively coupled to said columns of said plurality of memory cells, one of said word lines being driven to an active level so that said memory cells coupled thereto supply data bits to said plurality of bit lines, respectively, one of said generally rectangular active areas associated with crossing points between one of said plurality of bit lines and an adjacent two of said plurality of word lines having its longitudinal direction substantially aligned with the longitudinal directions of the respective generally rectangular active areas associated with an adjacent bit line and other adjacent two of said plurality of word lines next to an adjacent word line of one of said adjacent two of said plurality of word lines and with another adjacent bit line and yet other adjacent two of said plurality of word lines next to another word line to the other of said adjacent two of said plurality of word lines.

3. A semiconductor memory device as set forth in claim 2, in which each of said plurality of memory cells is implemented by a series combination of a switching transistor and a storage capacitor.

4. A semiconductor memory device as set forth in claim 3, in which said storage capacitor is of a stacked type having an accumulating electrode, a dielectric film structure and a counter electrode provided over said switching transistor.

5. A semiconductor memory device as set forth in claim 4, in which each of said plurality of bit lines passes over said storage capacitors forming parts of said plurality of memory cells, and is held in contact with said switching transistor through a contact hole formed in an inter-level insulating film structure provided between said storage capacitors and said plurality of bit lines.

6. A semiconductor memory device as set forth in claim 4, in which inter-level insulating films are provided between said word lines and said storage capacitors forming parts of said plurality of memory cells, and in which said bit lines extend between said inter-level insulating films and are held in contact with said switching transistors through contact holes formed in said inter-level insulating film.

7. A semiconductor memory device as set forth in claim 2, in which each of said word lines passes over one of said generally rectangular active area in one of said rows so as to provided a gate electrode of a switching transistor forming a part of one of said plurality of memory cells, and extends over an area between an adjacent two of said generally rectangular active areas in the next row, said area being defined in a thick filed oxide film, said area having a width as narrow as the minimum width allowed by design rules.

* * * * *

UNITED STATES PATENT AND TRADEMARK OFFICE
CERTIFICATE OF CORRECTION

PATENT NO. : 5,305,252

DATED : April 19, 1994

INVENTOR(S) : Takanori SAEKI

It is certified that error appears in the above-identified patent and that said Letters Patent is hereby corrected as shown below:

Column 13, line 58, delete "lien" and insert --line--.

Signed and Sealed this

Thirteenth Day of September, 1994

*Attest:*

BRUCE LEHMAN

*Attesting Officer*   *Commissioner of Patents and Trademarks*